United States Patent [19]
Nagai et al.

[11] Patent Number: 6,114,767
[45] Date of Patent: *Sep. 5, 2000

[54] EEPROM SEMICONDUCTOR DEVICE AND METHOD OF FABRICATING THE SAME

[75] Inventors: Takaaki Nagai; Masahiro Shinmori, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/124,851

[22] Filed: Jul. 30, 1998

[30] Foreign Application Priority Data

Jul. 31, 1997 [JP] Japan .................................. 9-205592

[51] Int. Cl.⁷ .................................................. H01L 23/48
[52] U.S. Cl. ........................... 257/758; 257/315; 257/390; 257/920
[58] Field of Search ...................................... 257/315, 316, 257/319, 390, 920, 758; 365/185.05, 185.12

[56] References Cited

U.S. PATENT DOCUMENTS

| 5,208,782 | 5/1993 | Sakuta et al. | 365/230.03 |
| 5,717,635 | 2/1998 | Akatsu | 365/185.05 |
| 5,834,807 | 11/1998 | Kim | 257/315 |
| 5,838,615 | 11/1998 | Kimaya et al. | 365/185.12 |

FOREIGN PATENT DOCUMENTS 3-52267  3/1991  Japan .
3-126266  5/1991  Japan .

Primary Examiner—David Hardy
Assistant Examiner—George C. Eckert, II
Attorney, Agent, or Firm—Foley & Lardner

[57] ABSTRACT

There is provided an EEPROM semiconductor device including (a) a plurality of field insulating films each extending perpendicularly to word lines, (b) a plurality of memory cells arranged in a matrix, each memory cell having a floating gate, a control gate formed on the floating gate and doubling as a word line, and source and drain regions located at either sides of the control gate, (c) a common source line extending in parallel with the word lines and connecting source regions of the memory cells with each other, and (d) a first bit line extending perpendicularly to the word lines and connecting drain regions of the memory cells with each other. The above-mentioned EEPROM semiconductor device makes it possible to form CMOS logic circuit together with a non-volatile memory on a common semiconductor substrate without increasing fabrication steps, and also makes it possible for the non-volatile memory to write data thereinto and read data therefrom at a higher rate without an increase in a cell size.

5 Claims, 13 Drawing Sheets

------- ORIGINAL SURFACE LEVEL

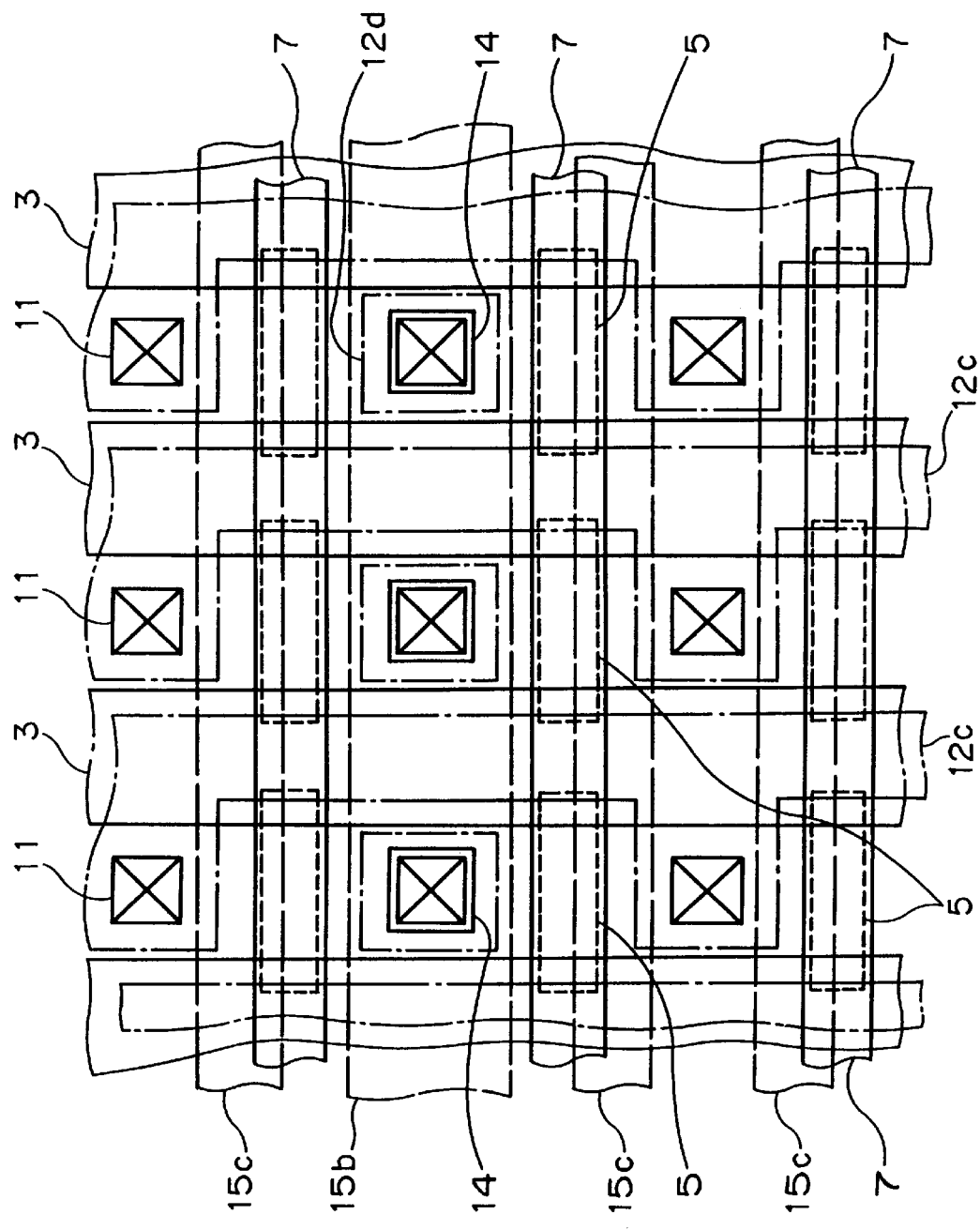

EEPROM SEMICONDUCTOR DEVICE AND METHOD OF FABRICATING THE SAME

BACKGROUND OF THE INVENTION

1. Field of the Invention

The invention relates to a semiconductor device, and more particularly to a semiconductor device including an electrically erasable programmable read only memory having a two-gate structure of a floating gate and a control gate deposited on the floating gate.

2. Description of the Related Art

An electrically erasable programmable read only memory (hereinafter, referred to simply as "EEPROM") generally includes, as a memory cell, MISFET memory transistor having a two-gate structure of a floating gate and a control gate formed on the floating gate. Data is written into or eliminated from the two-gate type EEPROM by introducing electric charges into or discharging electric charges from a floating gate.

For instance, data is written into the two-gate type EEPROM by introducing channel hot electrons, generated in drain regions, into a floating gate, whereas data is eliminated from EEPROM by introducing electrons into a source, for instance, by virtue of Fowler-Nordheim tunneling.

A conventional method of fabricating a two-gate type memory cell array is explained hereinbelow with reference to FIGS. 1, 2 and 3A to 3D, wherein FIG. 1 is a plan view of a conventional two-gate type memory cell array, FIG. 2 is a plan view illustrating the memory cell array being fabricated, and FIGS. 3A to 3D are cross-sectional views of the memory cell array taken along the line III—III in FIG. 1, showing respective steps of a method of fabricating the memory cell array.

As illustrated in FIG. 3A, a p-type well 2 is formed in a p-type semiconductor substrate 1 in a region where a memory cell array is to be formed. Then, a plurality of field insulating films 3 is formed in the form of islands by selective oxidation. The field insulating films 3 are not illustrated in FIG. 3A, but are illustrated in FIG. 2.

Then, a first gate insulating film 4 is formed all over the p-type well 2, and a first polysilicon layer 5a is formed all over the first gate insulating film 4 for forming a floating gate. Then, impurities such as phosphorus (P) are doped into the first polysilicon layer 5a by thermal diffusion or ion-implantation to thereby lower a resistance of the first polysilicon layer 5a. Then, as illustrated in FIG. 2, the first polysilicon layer 5a is patterned into a plurality of layers 5a in parallel with each other so that the layers 5a extend perpendicularly to word lines which will be formed later, in order to define a width thereof in a direction of a channel width of a floating gate.

Then, a second gate insulating film 6 is formed all over the product, and a second polysilicon layer 7a is formed over the second gate insulating film 6. Then, as illustrated in FIG. 3A, a patterned photoresist film 18a is formed on the second polysilicon layer 7a by photolithography and dry etching. The photoresist film 18a has a pattern for forming word lines.

Then, as illustrated in FIG. 3B, the second and first polysilicon layers 7a and 5a are patterned with the patterned photoresist film 18a being used as a mask, to thereby form control gates 7 and floating gates 5. After removal of the photoresist film 18a, impurities such as arsenic (As) are ion-implanted into the product with the deposited gates 5 and 7 and the field insulating films 3 being used as a mask, to thereby form drain regions 8a and source regions 8b.

Then, as illustrated in FIG. 3C, sidewall spacers 9 are formed around a sidewall of the deposited gates 5 and 7 of each of memory cells in order to cause MOS transistors located outside memory cell array regions to have a LDD-structure. Thereafter, a first interlayer insulating film 10 is deposited all over the product. The first interlayer insulating film 10 is composed of boron phospho silicate glass (BPSG), and has a thickness in the range of 6000 to 8000 angstroms.

Then, there is formed a photoresist film 18e having a hole above the drain region 8a. Then, the first interlayer insulating film 10 is etched with the photoresist film 18e being used as a mask, to thereby form a contact hole 11 leading to the drain region 8a.

After removal of the photoresist film 18e, aluminum alloy is deposited by sputtering by a thickness in the range of 4000 to 6000 angstroms. Then, the aluminum alloy is patterned by photolithography and dry etching to thereby form bit lines 12 extending perpendicularly to the word lines. Then, the product is entirely covered with a passivation film 16 composed of PSG and having a thickness of about 5000 angstroms. Thus, there is completed a memory cell array.

While the above-mentioned method is being carried out, a region 3a (a hatched region in FIG. 2) which is sandwiched between the field insulating films 3 and will become a source region is exposed to etching twice, namely, when the first polysilicon layer 5a is patterned and when the second polysilicon layer 7a is patterned. When the first polysilicon layer 5a is patterned, the region 3a is covered merely with the thin first gate insulating film 4 after the first polysilicon layer 5a has been etched. Hence, the first gate insulating film 4 is first removed, and then, the p-type semiconductor substrate 1 is undesirably etched. In addition, when the second polysilicon layer 7a is patterned, the region 3a is covered merely with the thin second gate insulating film 6 after the second polysilicon layer 7a has been etched. Hence, the p-type semiconductor substrate 1 is undesirably further etched.

As a result, as illustrated in FIG. 4 which is a cross-sectional view taken long the line IV—IV in FIG. 1, there is formed an undesirable recess 19 at a surface of the semiconductor substrate 1. The undesirable recess 19 causes junction leakage therein, which is a problem that data-writing and data-eliminating properties are deteriorated.

If a diffusion layer had a depth shallower than a depth of the recess 19, there is formed a breakage in a source region at the recess 19, since impurities are not ion-implanted into an inner sidewall of the recess 19. This causes a reduction in a fabrication yield.

The above-mentioned problem can be solved by a semiconductor device structure as suggested in Japanese Unexamined Patent Publications Nos. 3-52267 and 3-126266, for instance. Hereinafter is explained the suggested structure with reference to FIGS. 5, 6, 7 and 8A to 8D, wherein FIG. 5 is a plan view of the suggested memory cell array, FIG. 6 is a cross-sectional view taken along the line VI—VI in FIG. 5, FIG. 7 is a cross-sectional view taken along the line VII—VII in FIG. 5, and FIGS. 8A to 8D are cross-sectional views taken along the line VI—VI in FIG. 5, showing respective steps of a method of fabricating the suggested memory cell array.

The suggested memory cell array is characterized by that a plurality of the field insulating films 3 extend perpendicularly to the word lines 7, and that the common source line 17a connecting the source regions 8b to each other in a direction in which the word lines 7 extend is formed to extend perpendicularly to the field insulating films 3. Hereinafter is explained a method of fabricating the suggested memory cell array, with reference to FIGS. 8A to 8D.

As illustrated in FIG. 8A, a p-type well 2 is formed in a p-type semiconductor substrate 1 by introducing p-type impurities into the semiconductor substrate 1 and thermally diffusing the p-type impurities in the semiconductor substrate 1. Then, a plurality of field insulating films 3 are formed on a principal surface of the p-type well 2 by selective oxidation so that the field insulating films 3 extend in parallel with one another, but perpendicularly to word lines which will be formed later. The field insulating films 3 are not illustrated in FIG. 8A, but only illustrated in FIG. 5.

Then, a first gate insulating film 4 and then a first polysilicon layer 5a are formed all over the product. Then, impurities such as phosphorus (P) are ion-implanted into the first polysilicon layer 5a to thereby lower a resistance of the first polysilicon layer 5a. Then, as illustrated in FIG. 2, the first polysilicon layer 5a is patterned into a plurality of layers 5a in parallel with each other in order to define a width thereof in a direction of a channel width of a floating gate. When the first polysilicon layer 5a is patterned, the thick field insulating films 3 exist below a region where the first polysilicon layer 5a is etched, which ensures that the substrate 1 is not etched, and hence a recess such as the recess 19 illustrated in FIG. 4 is not formed.

Then, a second gate insulating film 6 is formed all over the product, and a second polysilicon layer 7a is formed over the second gate insulating film 6. Then, impurities such as phosphorus (P) are ion-implanted into the second polysilicon layer 7a to thereby lower a resistance thereof Then, as illustrated in FIG. 8A, a patterned photoresist film 18a is formed on the second polysilicon layer 7a by photolithography and dry etching. The photoresist film 18a has a pattern for forming word lines.

Then, as illustrated in FIG. 8B, the second and first polysilicon layers 7a and 5a are patterned by etching with the patterned photoresist film 18a being used as a mask, to thereby form control gates 7 and floating gates 5. After removal of the photoresist film 18a , n-type impurities are ion-implanted into the product with the deposited gates 5 and 7 and the field insulating films 3 being used as a mask, to thereby form drain regions 8a and source regions 8b.

Then, as illustrated in FIG. 8C, sidewall spacers 9 are formed around a sidewall of the deposited gates 5 and 7 of each of memory cells. Thereafter, a first interlayer insulating film 10 is deposited all over the product by chemical vapor deposition (CVD). The first interlayer insulating film 10 is composed of silicon dioxide. Then, the first interlayer insulating film 10 is etched in selected regions to thereby form contact holes C1 reaching a surface of the source regions 8b and contact holes C2 reaching a surface of the drain regions 8a.

Then, as illustrated in FIG. 8D, an electrically conductive layer composed of polysilicon is formed all over the product, and then patterned to thereby form a common source line 17a and an extended bit line 17b. The common source line 17a connects the source regions 8b in a direction in which the word lines extend. The extended bit line 17b makes electrical contact with the drain region 8a through the contact hole C2, and covers a portion of the first interlayer insulating film 10 around the contact hole C2 therewith. The electrically conductive layer from which the common source line 17a and the extended bit line 17b are formed may be composed of refractory metal, silicide thereof, or polycide thereof, as well as polysilicon.

Then, a second interlayer insulating film 13 composed of BPSG is deposited all over the product. Thereafter, a photoresist film 18c is formed, and then, patterned by photolithography and dry etching so as to have an opening above the extended bit line 17b. Then, the second interlayer insulating film 13 is etched with the patterned photoresist film 18c being used as a mask, to thereby form through-holes 14 reaching the extended bit line 17b.

After removal of the photoresist film 18c, aluminum alloy is deposited by sputtering. Then, the aluminum alloy is patterned by photolithography and dry etching to thereby form bit lines 12 (see FIGS. 5, 6 and 7) extending perpendicularly to the word lines. Then, the product is entirely covered with a passivation film 16 (see FIGS. 4, 6 and 7) composed of PSG. Thus, there is completed a non-volatile semiconductor memory device as illustrated in FIGS. 4 to 7.

In accordance with the above-mentioned method, when the first polysilicon layer 5a is etched, the thick field insulating films 3 exist below a region to be etched. When the second and first polysilicon layers 7a and 5a are patterned to thereby form the control gate 7 and the floating gate 5, a region where only a single polysilicon layer is etched is a region located above the field insulating regions 3. Hence, the above-mentioned undesirable recess 19 caused by etching a polysilicon layer is not formed. Accordingly, there is solved a problem that junction leakage junction leakage occurs due to the recess, and resultingly data-writing and data-eliminating properties are deteriorated, and that a fabrication yield due to the breakage in a source region is reduced.

A semiconductor device including a high-rate CMOS logic circuit is generally designed to have two or more wiring layers. When a non-volatile memory is formed on a common semiconductor substrate on which a high-rate CMOS logic circuit is also formed, it is required that an increase in the number of additional fabrication steps is avoided and that the non-volatile memory is small in size, in order to reduce fabrication costs and integrate the device in a higher density.

In the conventional method having been explained with reference to FIGS. 5, 6, 7 and 8A to 8D, the common source line is formed of the electrically conductive layer composed of electrically conductive material such as polysilicon, after the contact hole has been formed. Hence, the above-mentioned conventional method has a problem that the number of additional fabrication steps is increased relative to the number of steps for fabricating CMOS logic circuit having two or more wiring layers, and hence, fabrication costs are also increased.

In addition, since the common source line is formed of an electrically conductive layer composed of polysilicon, the common source line unavoidably has high resistivity, which causes problems that data-writing and data-eliminating properties of a non-volatile memory are deteriorated, and that a speed at which a memory cell reads out data is reduced.

The common source line may be designed to have a smaller resistance by increasing an area of the electrically conductive layer and/or forming a backing wiring layer composed of aluminum. However, this makes it difficult to reduce a size of a memory cell, and reduce fabrication costs per a chip.

SUMMARY OF THE INVENTION

It is an object of the present invention to provide an electrically erasable programmable read only memory which is capable of being formed commonly on a semiconductor substrate on which a high-rate CMOS semiconductor device is also formed, without an increase in the number of additional fabrication steps, and also capable of writing data thereinto and reading data therefrom at a high rate without an increase in a cell size.

The above-mentioned object can be accomplished by presenting a non-volatile memory including memory cells having a floating gate and a control gate doubling as a word line, field insulating films each extending perpendicularly to word lines to thereby electrically insulate the memory cells from one another, a common source line extending in parallel to the word lines to thereby connect source regions of the memory cells to one another, and a bit line extending perpendicularly to the word lines to thereby connect drain regions of the memory cells to one another. The common source line may be formed of a first metal wiring layer, and the bit line may be formed of a second metal wiring layer.

Specifically, in one aspect of the present invention, there is provided an EEPROM semiconductor device including (a) a plurality of field insulating films each extending perpendicularly to word lines, (b) a plurality of memory cells arranged in a matrix, each memory cell including a floating gate, a control gate formed on the floating gate and doubling as a word line, and source and drain regions located at either sides of the control gate, (c) a common source line extending in parallel with the word lines and connecting source regions of the memory cells with each other, and (d) a first bit line extending perpendicularly to the word lines and connecting drain regions of the memory cells with each other.

The common source line may be constituted of a first metal wiring layer, which is preferably composed of aluminum. The bit line may be constituted of a second metal wiring layer, which is preferably composed of aluminum.

The EEPROM semiconductor device may further include a plurality of second bit lines formed above the drain regions of the memory cells, in which case, it is preferable that the first bit line connects the second bit lines with one another.

It is preferable that both the second bit lines and the common source line are constituted of a first metal wiring layer, which is preferably composed of aluminum.

The EEPROM semiconductor device may further include CMOS logic circuit including both the common source line and the first bit line, and formed on a common semiconductor substrate.

There is further provided an EEPROM semiconductor device including (a) a plurality of field insulating films each extending perpendicularly to word lines, (b) a plurality of memory cells arranged in a matrix, each memory cell including a floating gate, a control gate formed on the floating gate and doubling as a word line; and source and drain regions located at either sides of the control gate, (c) a first bit line extending perpendicularly to the word lines and connecting drain regions of the memory cells with each other, and (d) a first common source line extending in parallel with the word lines and connecting source regions of the memory cells with each other.

The EEPROM semiconductor device may further include a plurality of second common source lines formed above the source regions of the memory cells, in which case, the first common source line preferably connects the second common source lines with one another.

It is preferable that both the second common source lines and the bit line are constituted of a first metal wiring layer, which is preferably composed of aluminum.

The EEPROM semiconductor device may further include backing wiring layers each of which is connected to the word lines at every certain number of bits, in which case, it is preferable that both the backing wiring layers and the first common source lines are constituted of a second metal wiring layer.

In another aspect, there is provided a method of fabricating an EEPROM semiconductor device, including the steps of (a) forming a plurality of field insulating films in parallel on a semiconductor substrate, (b) forming a first gate insulating film in each of active regions, (c) forming a plurality of first polysilicon layers in parallel with one another perpendicularly to word lines, (d) forming a second gate insulating film and a second polysilicon layer all over the product resulting from the step (c), (e) patterning the second polysilicon layer, the second gate insulating film, and the first polysilicon layer to thereby form a control gate and a floating gate, (f) forming drain and source regions, (g) forming a first interlayer insulating layer all over the product resulting from the step (f), (h) forming a first metal wiring layer which is patterned so as to form both a common source line extending in parallel with the word lines and connecting source regions to one another, and an extended bit line connecting the drain region to a bit line, (i) forming a second interlayer insulating layer all over the product resulting from the step (h), and (j) forming a second metal wiring layer which is patterned so as to form a bit line connecting the drain regions to one another.

The second gate insulating film may have a three-layered structure of oxide/nitride/oxide films.

There is further provided a method of fabricating an EEPROM semiconductor device, including the steps of (a) forming a plurality of field insulating films in parallel on a semiconductor substrate, (b) forming a first gate insulating film in each of active regions, (c) forming a plurality of first polysilicon layers in parallel with one another perpendicularly to word lines, (d) forming a second gate insulating film and a second polysilicon layer all over the product resulting from the step (c), (e) patterning the second polysilicon layer, the second gate insulating film, and the first polysilicon layer to thereby form a control gate and a floating gate, (f) forming drain and source regions, (g) forming a first interlayer insulating layer all over the product resulting from the step (f), (h) forming a first metal wiring layer which is patterned so as to form both a bit line extending almost in parallel with the field insulating films and connecting drain regions to one another, and an extended common source line connecting the source region to a later mentioned common source line, (i) forming a second interlayer insulating layer all over the product resulting from the step (h), and (j) forming a second metal wiring layer which is patterned so as to form a common source line connecting the source regions to one another.

The method may further include the step of forming backing wiring layers connecting to the control gate at a certain interval, in which case, the backing wiring layers are preferably constituted of the second metal wiring layer.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 17 is a plan view of a memory cell array in accordance with the third embodiment of the present invention.

DESCRIPTION OF THE PREFERRED EMBODIMENTS

First Embodiment

Figure 9:
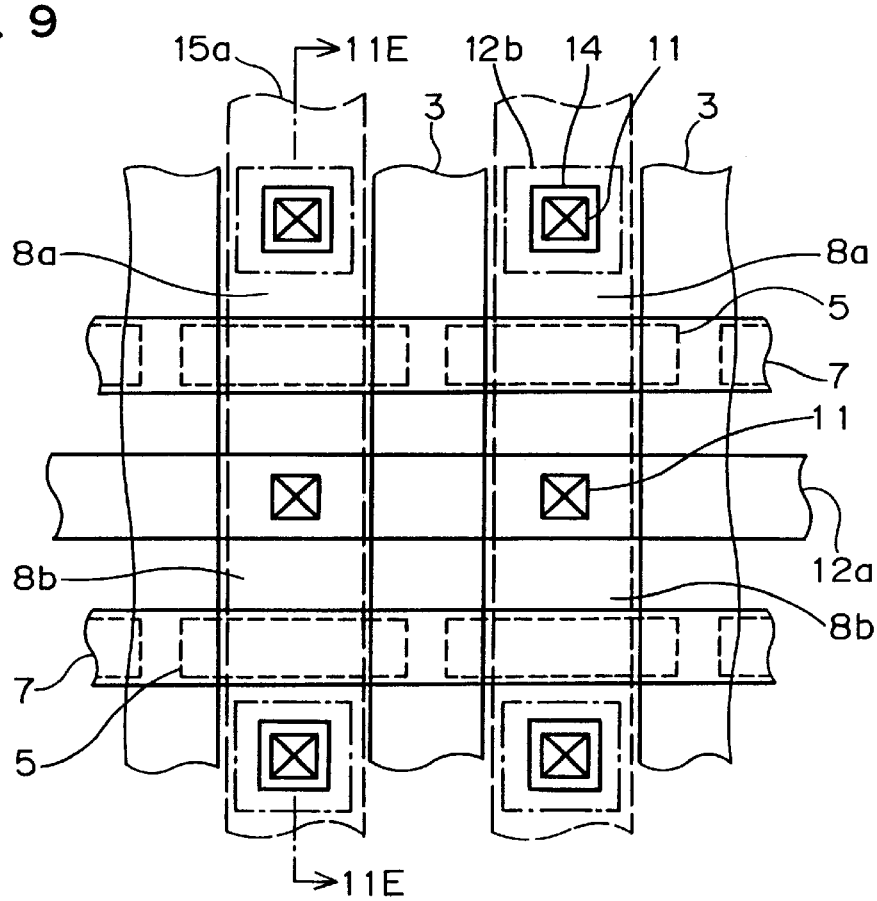
FIG. 9 is a plan view of a memory cell array in accordance with the first embodiment of the present invention.

FIG. 9 illustrates a memory cell array in accordance with the first embodiment. As illustrated in FIG. 9, a plurality of field insulating films 3 is formed in parallel perpendicularly to word lines. Control gates 7 doubling as word lines extend perpendicularly to the field insulating films 3. Floating gates 5 are formed on channel regions located below the control gates 7. That is, the control gates 7 are deposited on the floating gates 5. Drain regions 8a and source regions 8b are formed in a semiconductor substrate at either sides of the deposited gates 7 and 5.

The source regions 8b are connected to each other via contact holes 11 through a common source line 12a extending in parallel with the word lines and composed of a first aluminum wiring layer. The drain regions 8a are connected to extended bit lines 12b composed of the first aluminum wiring layer via the contact hole 11, and are connected to one another through a bit line 15a composed of a second aluminum wiring layer in a direction perpendicular to the word lines.

A method of fabricating the memory cell array in accordance with the first embodiment is explained hereinbelow with reference to FIGS. 11A to 11E.

Figure 11A:
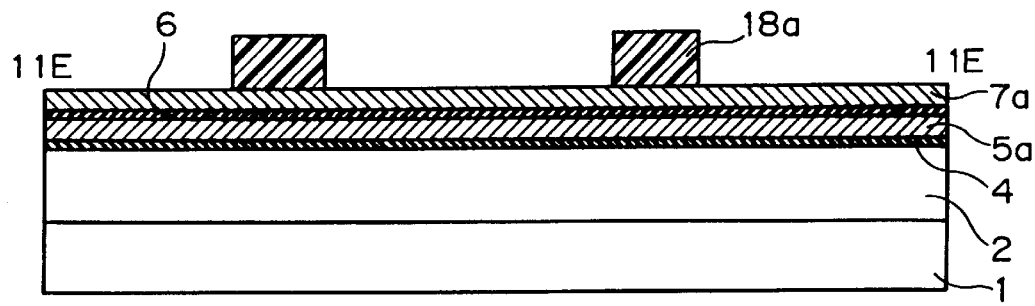
FIGS. 11A to 11E are cross-sectional views taken along the line 11E—11E in FIG. 9, illustrating respective steps of a method of fabricating the memory cell array illustrated in FIG. 9.

As illustrated in FIG. 11A, a p-type semiconductor substrate 1 is ion-implanted at about 100 KeV with doses of about $1\times10^{13}$ atoms/cm$^2$ with p-type impurities such as boron (B), followed by annealing at about 1000°C. Thus, there is formed a p-type well 2 in the p-type semiconductor substrate 1 in a region where a memory cell array is to be formed.

Then, a plurality of field insulating films 3 composed of silicon dioxide are formed in parallel by selective oxidation. The field insulating films 3 extend perpendicularly to word lines which will be formed later, and have a thickness in the range of 4000 to 8000 angstroms. The field insulating films 3 are not illustrated in FIG. 11A, but only illustrated in FIG. 10.

Then, a substrate surface of active regions are thermally oxidized at a temperature in the range of 700 to 850 degrees centigrade to thereby form a first gate insulating film 4 which will make a gate oxide film of memory cells. The thus formed first gate insulating film 4 has a thickness of about 100 angstroms.

Then, a first polysilicon layer 5a is formed all over the first gate insulating film 4 by a thickness in the range of about 1500 to about 2500 angstroms by reduced pressure CVD. The first polysilicon layer 5a will make a floating gate. Then, n-type impurities such as phosphorus (P) are doped into the first polysilicon layer 5a by thermal diffusion or ion-implantation to thereby lower a resistance of the first polysilicon layer 5a.

Figure 10:
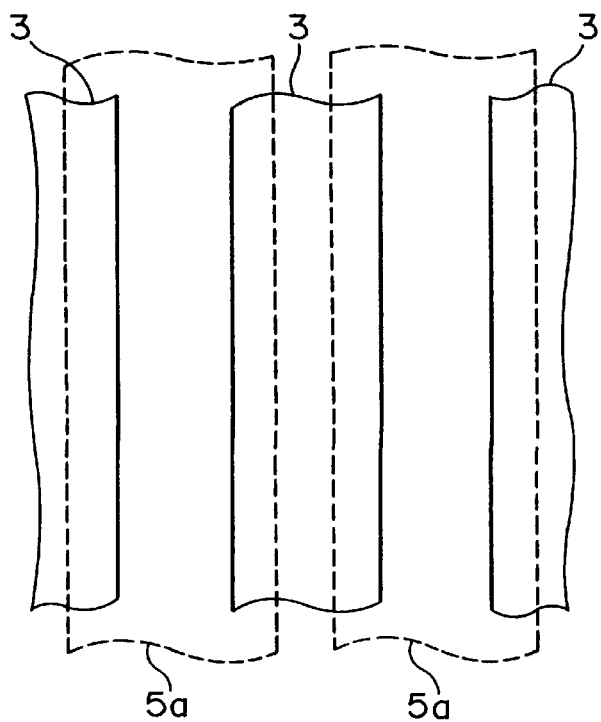
FIG. 10 is a plan view of the memory cell array illustrated in FIG. 9, being fabricated.

Then, as illustrated in FIG. 10, the first polysilicon layer 5a is patterned by photolithography and dry etching into a plurality of layers 5a in parallel with each other so that the layers 5a extend perpendicularly to word lines which will be formed later, in order to define a width thereof in a direction of a channel width of a floating gate.

Figure 1:
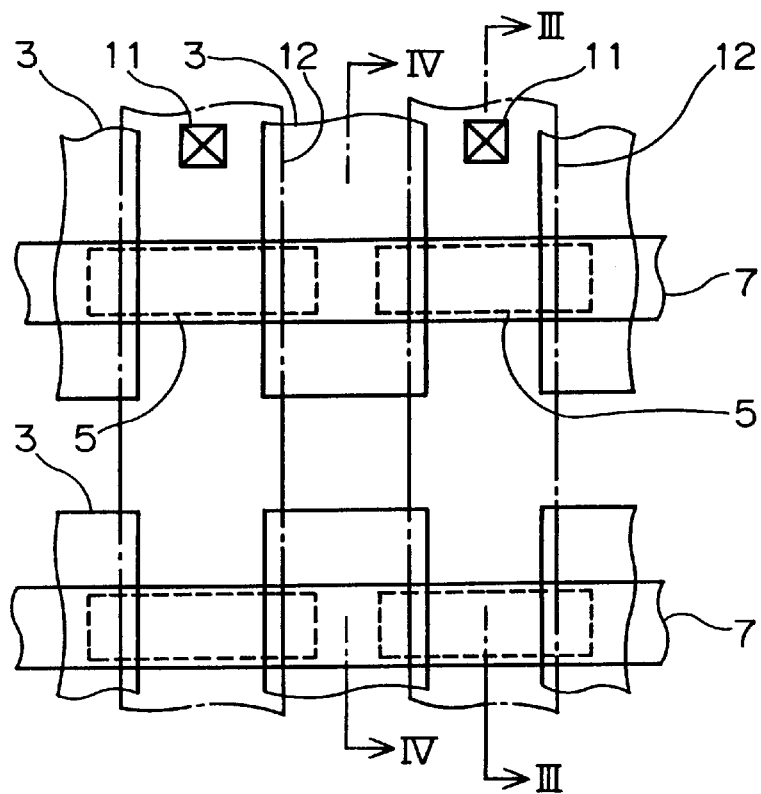
FIG. 1 is a plan view of a conventional memory cell array.
Figure 2:
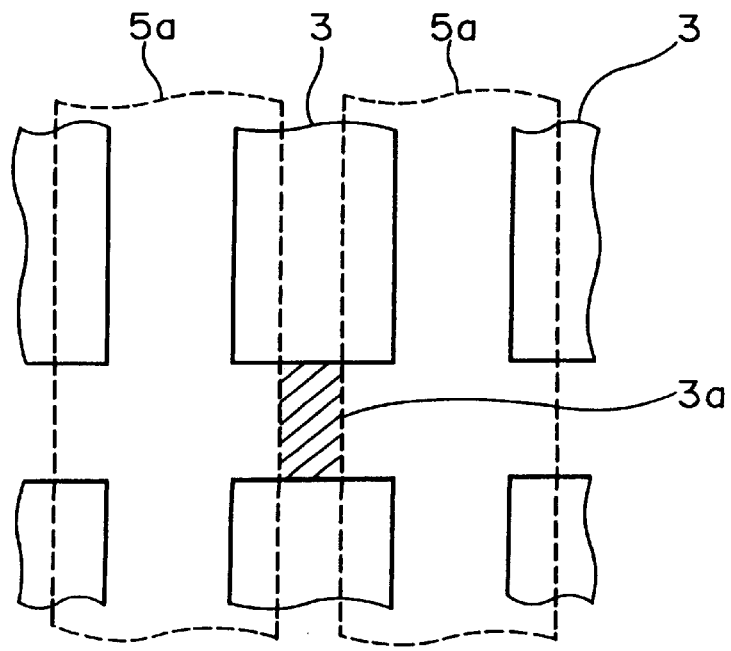
FIG. 2 is a plan view of the conventional memory cell array illustrated in FIG. 1, being fabricated.
Figure 3A:
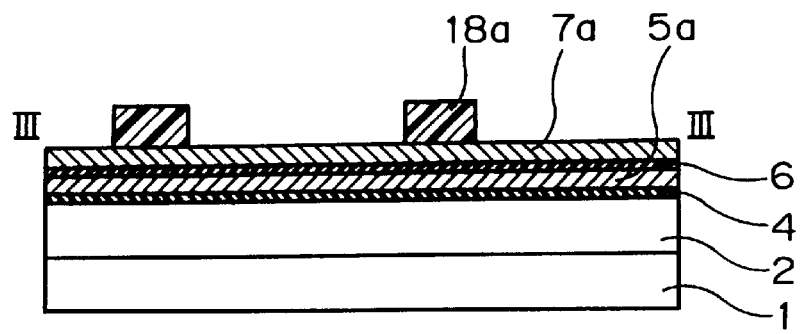
FIGS. 3A to 3D are cross-sectional views taken along the line III—III in FIG. 1, illustrating respective steps of a method of fabricating the memory cell array illustrated in FIG. 1.
Figure 3B:
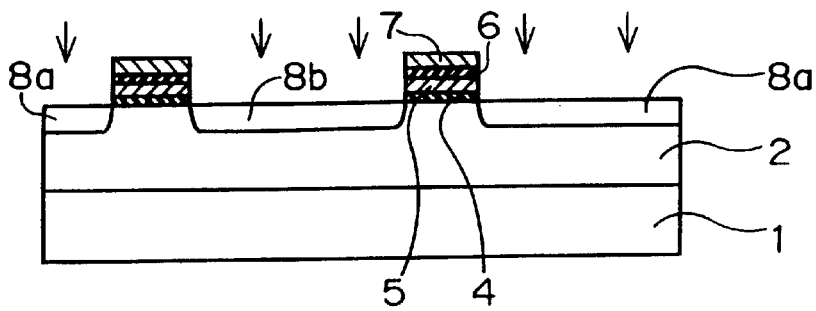
Figure 3C:
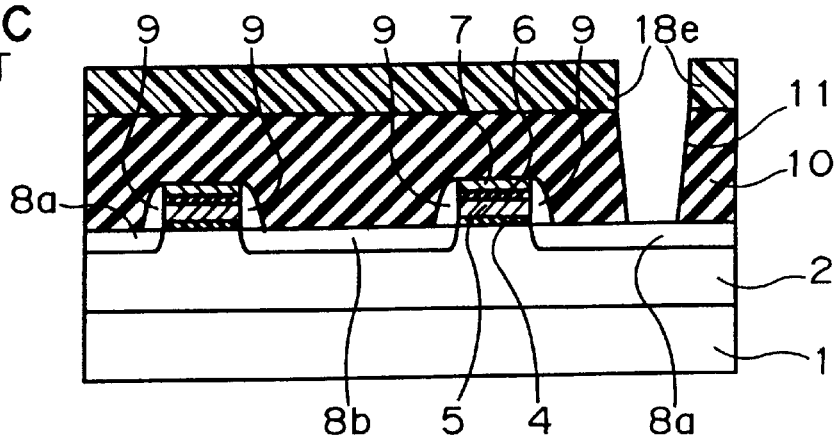
Figure 3D:
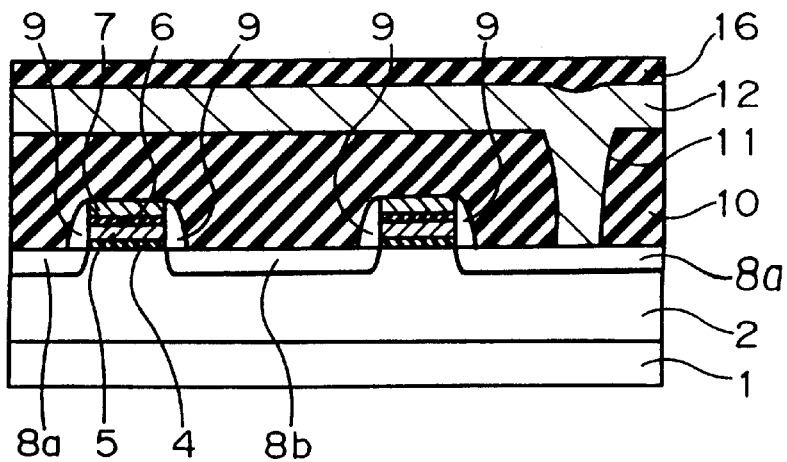
Figure 4:
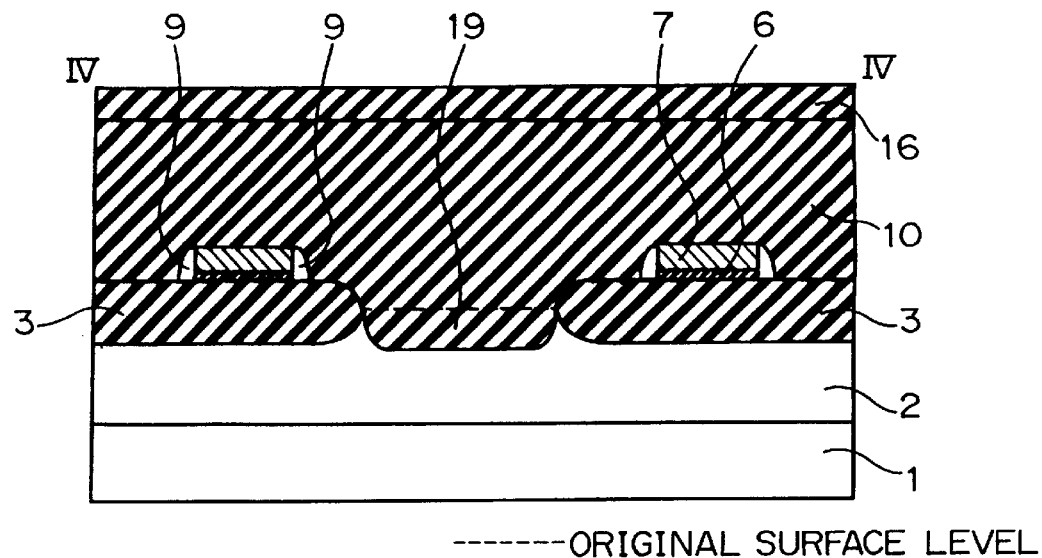
FIG. 4 is a cross-sectional view taken along the line IV—IV in FIG. 1.
Figure 5:
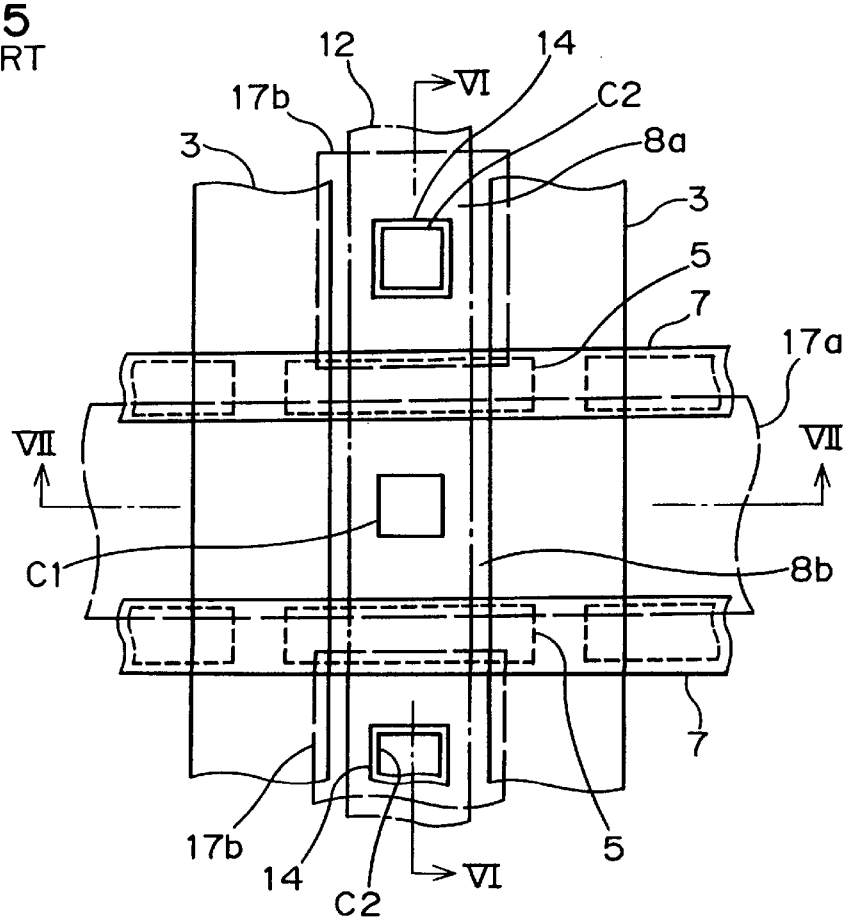
FIG. 5 is a plan view of another conventional memory cell array.
Figure 6:
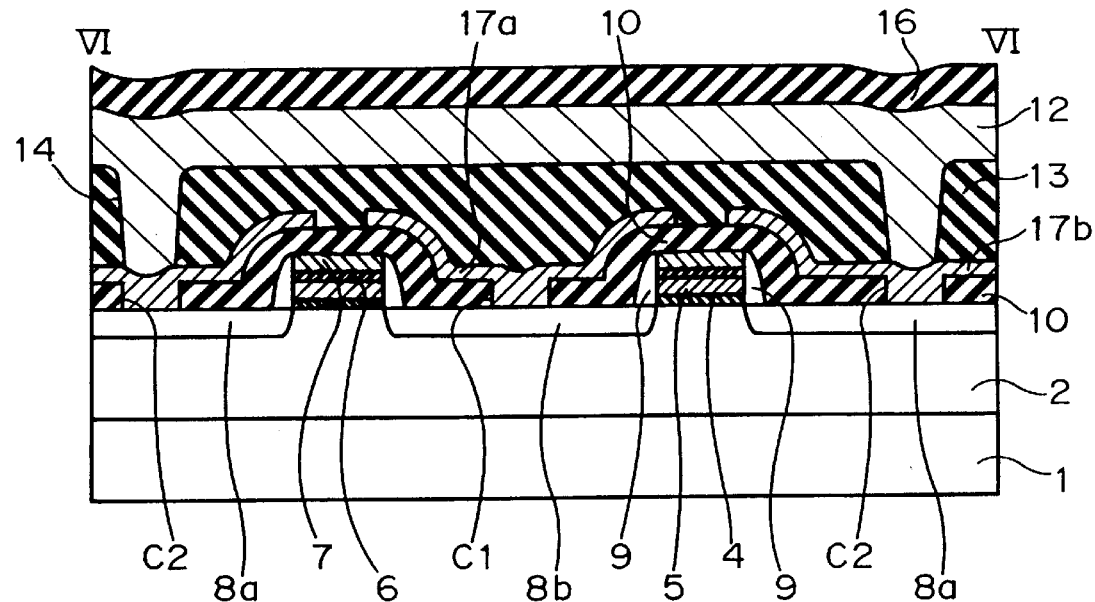
FIG. 6 is a cross-sectional view taken along the line VI—VI in FIG. 5.
Figure 7:
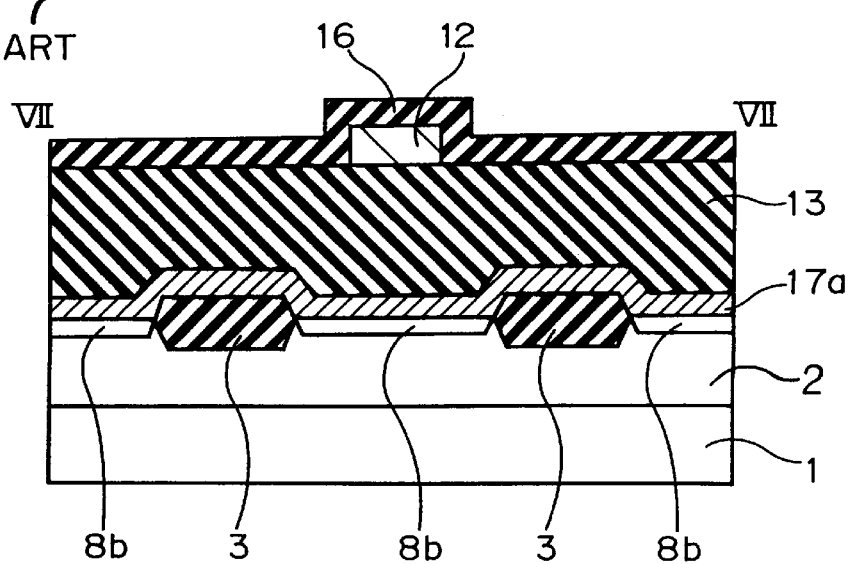
FIG. 7 is a cross-sectional view taken along the line VII—VII in FIG. 5.
Figure 8A:
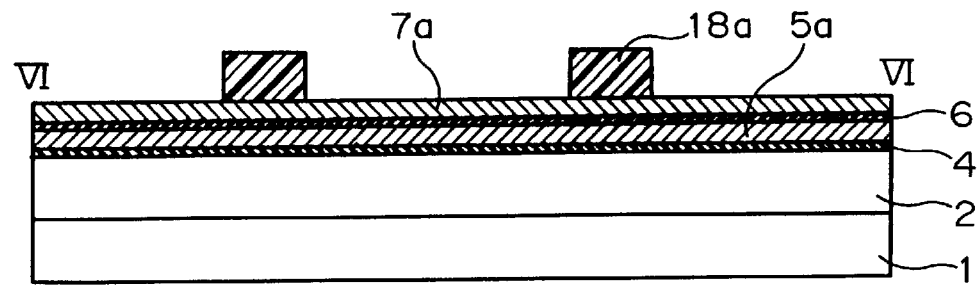
FIGS. 8A to 8D are cross-sectional views taken along the line VI—VI in FIG. 5, illustrating respective steps of a method of fabricating the memory cell array illustrated in FIG. 5.
Figure 8B:
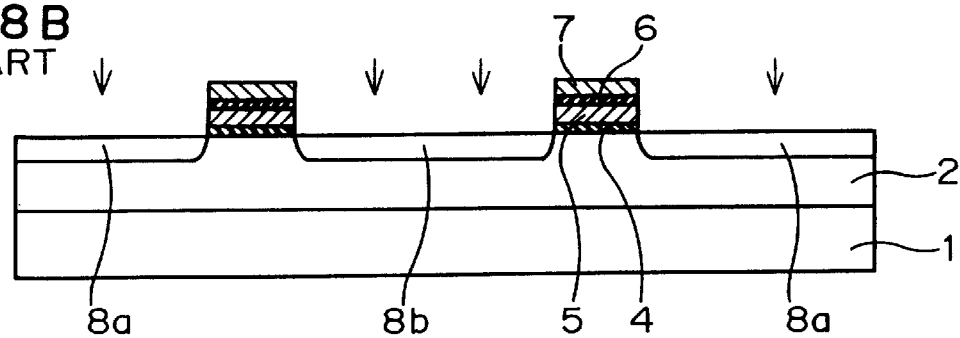
Figure 8C:
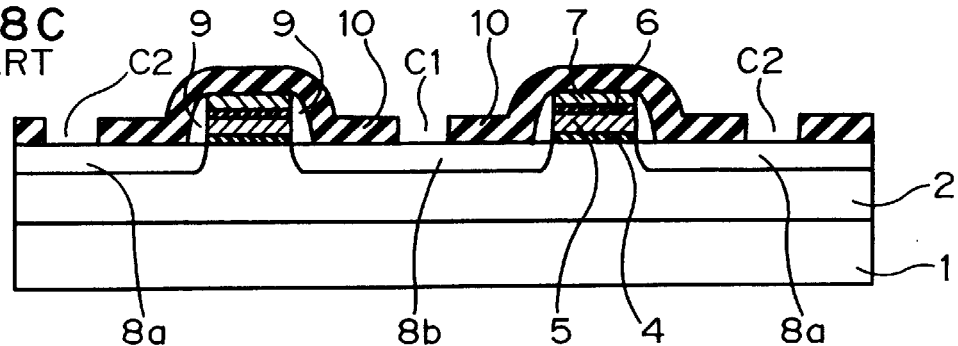
Figure 8D:
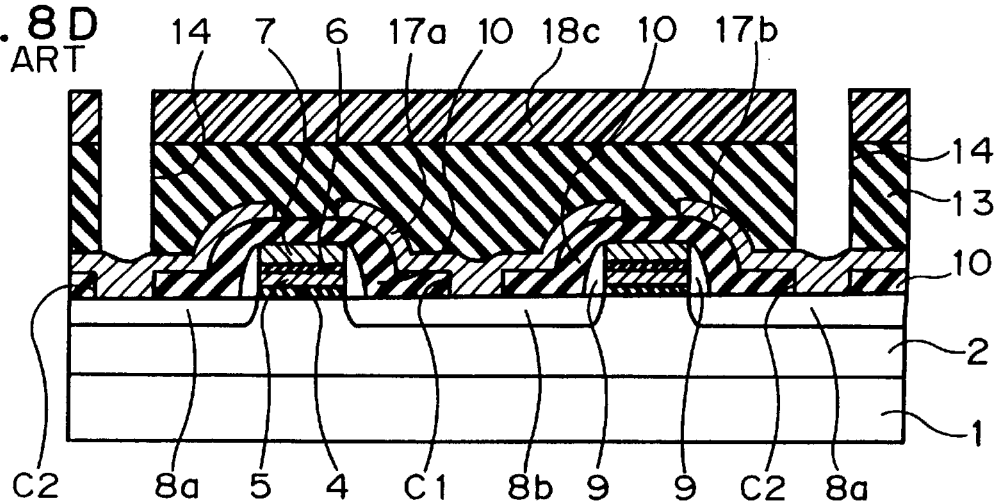

When the first polysilicon layer 5a is patterned, the thick field insulating films 3 exist below a region where the first polysilicon layer 5a is etched, which ensures that the substrate 1 is not etched in an etching step for forming a gate electrode, and hence a recess such as the recess 19 illustrated in FIG. 4 is not formed.

Then, a second gate insulating film 6 having a thickness in the range of about 200 to about 300 angstroms is formed all over the product by thermal oxidation or CVD. The second gate insulating film 6 may be designed to have a three-layered structure of oxide/nitride/oxide films, which called ONO film.

The second gate insulating film 6 formed outside a region where memory cell array is to be formed is removed by wet or dry etching, using acid such as hydrofluoric acid. Thereafter, a second polysilicon layer 7a is formed all over the second gate insulating film 6 by reduced pressure CVD. The second polysilicon layer 7a will make a control gate and a gate electrode of peripheral transistors. Then, n-type impurities such as phosphorus (P) are introduced into the second polysilicon layer 7a by thermal diffusion or ion-implantation to thereby lower a resistance thereof. On the second polysilicon layer 7a may be formed a film composed of silicide of refractory metal such as W, Ti and Mo to thereby form a polycide structure film.

Then, as illustrated in FIG. 11A, a patterned photoresist film 18a is formed on the second polysilicon layer 7a by photolithography and dry etching. The photoresist film 18a has a pattern for forming control gates.

Figure 11B:
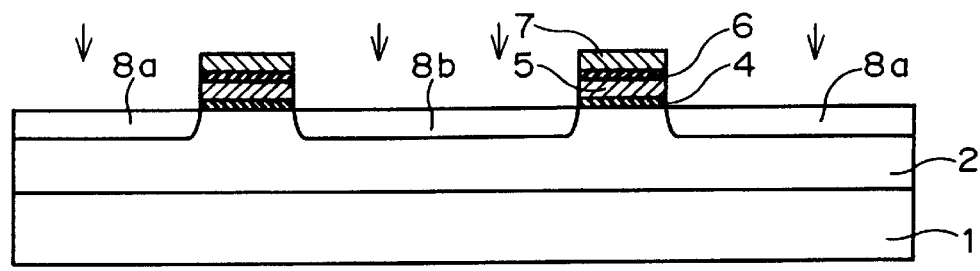

Then, as illustrated in FIG. 11B, the second polysilicon layer 7a, the second gate insulating film 6 and the first polysilicon layer 5a are patterned by reactive ion etching (RIE) with the patterned photoresist film 18a being used as a mask, to thereby form control gates 7 and floating gates 5 in self-align fashion.

After removal of the photoresist film 18a, the product is ion-implanted at about 50 to 70 KeV with doses of about $1\times10^{15}$ atoms/cm$^2$ with n-type impurities such as arsenic (As) with the deposited gates 5 and 7 and the field insulating films 3 being used as a mask, to thereby form drain regions 8a and source regions 8b.

Figure 11C:
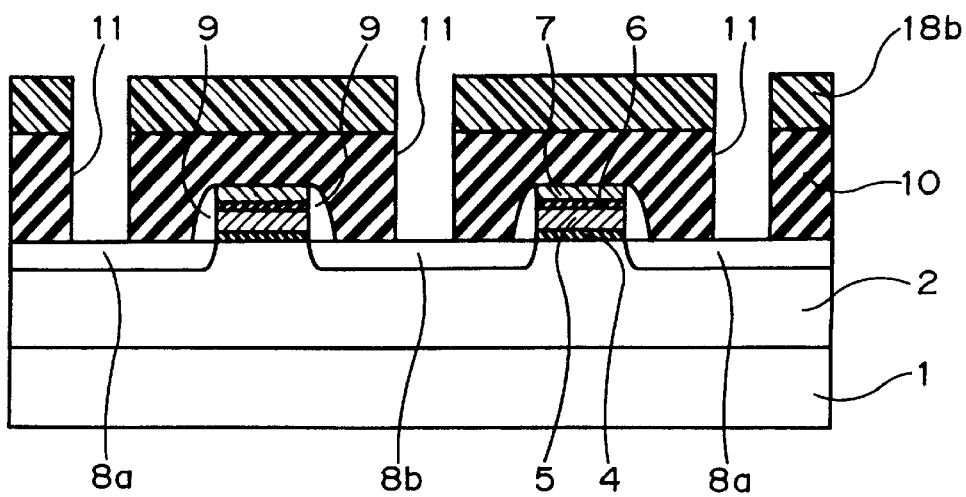

Then, as illustrated in FIG. 11C, sidewall spacers 9 are formed around a sidewall of the deposited gates 5 and 7 of each of memory cells in order to cause CMOS transistors located outside memory cell array regions to have a LDD-structure. Thereafter, a first interlayer insulating film 10 is deposited all over the product by chemical vapor deposition (CVD). The first interlayer insulating film 10 is composed of BPSG and has a thickness in the range of 6000 to 8000 angstroms. Then, there is formed a photoresist film 18b by photolithography and dry etching. The photoresist film 18b has openings above the source regions 8b and the drain regions 8a. Then, the first interlayer insulating film 10 is etched by RIE in selected regions with the photoresist film 18b being used as a mask, to thereby form contact holes 11 reaching all the source and drain regions 8b and 8a of the memory cells.

Figure 11D:
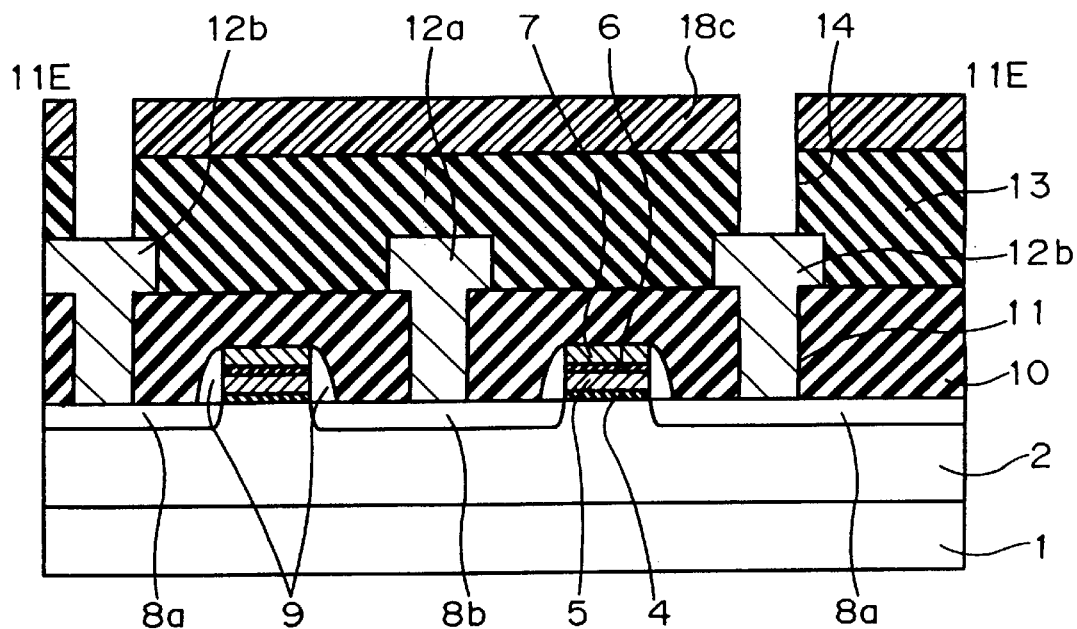

Then, as illustrated in FIG. 11D, aluminum alloy is deposited over the product by sputtering by a thickness in the range of about 4000 to about 6000 angstroms. The thus deposited aluminum alloy is patterned to thereby form a common source line 12a and an extended bit line 12b both as a first aluminum wiring layer. The common source line 12a extends in parallel with the word lines, and connects the source regions 8b located in a direction in which the word lines extend, to one another. The extended bit line 12b is a junction through which the drain regions 8a make electrical contact with a bit line.

Then, a second interlayer insulating film 13 composed of BPSG is deposited all over the product by CVD. The second interlayer insulating film 13 has a thickness in the range of about 4000 to about 5000 angstroms. Thereafter, a photoresist film 18c is formed, and then, patterned by photolithography and dry etching so as to have an opening above the drain regions 8a. Then, the second interlayer insulating film 13 is etched by RIE with the patterned photoresist film 18c being used as a mask, to thereby form through-holes 14 reaching the extended bit line 12b.

Figure 11E:
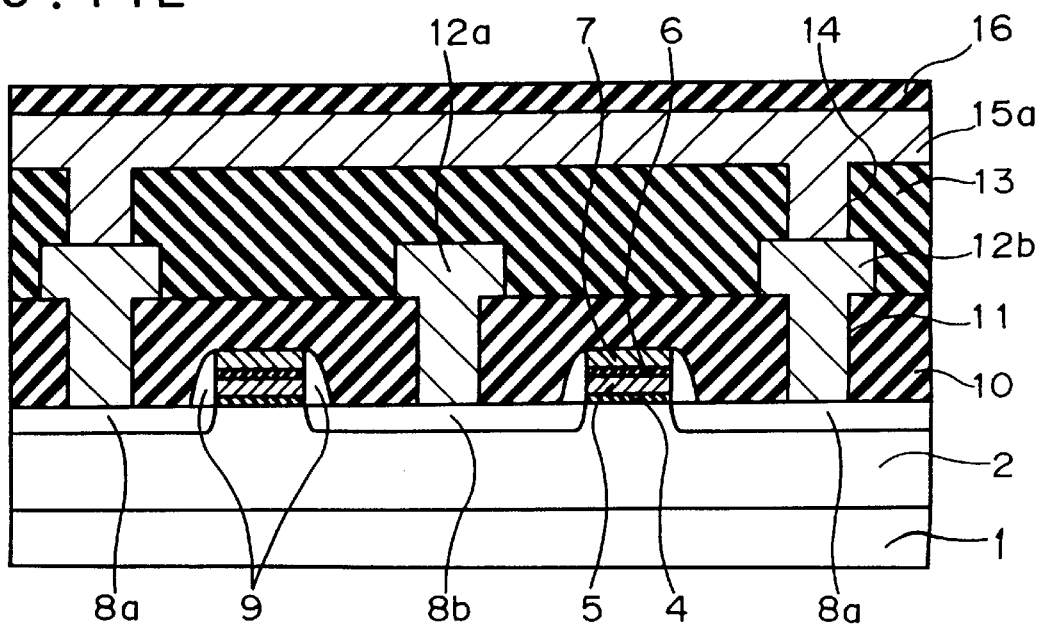
Figure 12:
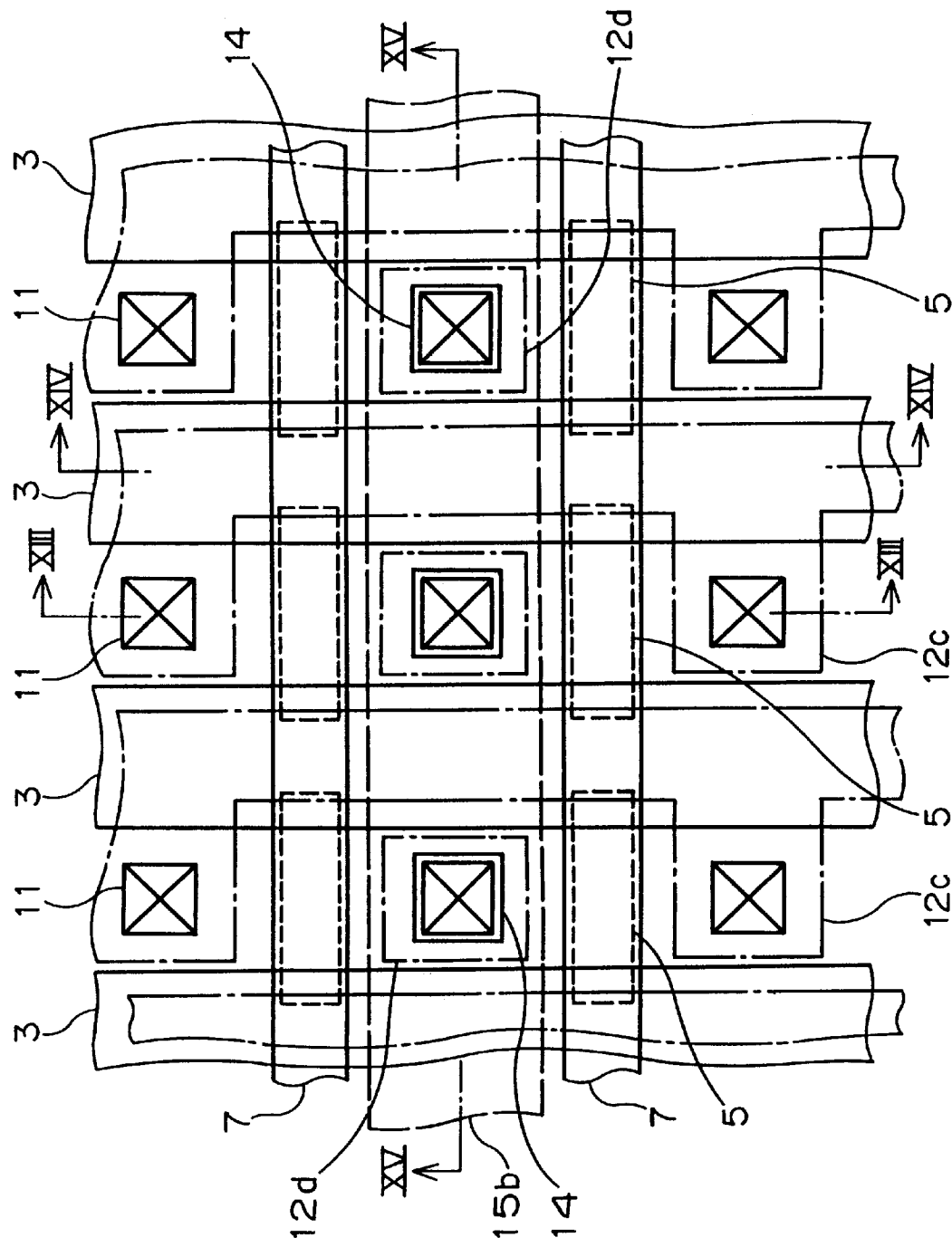
FIG. 12 is a plan view of a memory cell array in accordance with the second embodiment of the present invention.

After removal of the photoresist film 18c, as illustrated in FIG. 11E, an aluminum alloy film having a thickness in the range of about 4000 to about 6000 angstroms, as a second aluminum wiring layer, is deposited by sputtering over the product. Then, the aluminum alloy film is patterned by photolithography and dry etching to thereby form bit lines 15a in parallel with the field insulating film 3. The bit lines 15a connect the drain regions 8a located adjacent to the field insulating film 3, to one another.

In CMOS logic products where a memory cell is formed on a common substrate, wirings are also made in CMOS logic circuit in first and second metal wiring layers in a memory cell array region. If a contact hole or a through-hole were filled with metal such as tungsten (W) in CMOS logic circuit, wirings can be made in the same manner also in a memory cell array.

Then, the product is entirely covered with a passivation film 16 composed of PSG. Thus, there is completed the memory cell array in accordance with the first embodiment.

Second Embodiment

FIGS. 12 to 15 illustrate a memory cell array in accordance with the second embodiment.

The second embodiment is different from the first embodiment in that the bit line 12c is constituted of the first aluminum wiring layer, and the common source line 15b is constituted of the second aluminum wiring layer. In the second embodiment, the drain regions 8a arranged in parallel with the field insulating films 3 are connected to one another through the bit line 12c constituted of the first aluminum wiring layer and extending almost in parallel with the field insulating films 3, and a common extended source line 12d constituted of the first aluminum wiring layer is formed on the source regions 8b. The source regions 8b arranged in parallel with the word lines are connected commonly to the common source line 15b via the common extended source line 12d. The common source line 15b is constituted of the second aluminum wiring layer, and extends in parallel with the word lines.

A method of fabricating the memory cell array in accordance with the second embodiment is explained hereinbelow with reference to FIGS. 16A and 16B.

The method of fabricating the memory cell array in accordance with the second embodiment has the same fabrication steps from the first step to the step illustrated in FIG. 11C as those in the method of fabricating the memory cell array in accordance with the first embodiment.

Figure 16A:
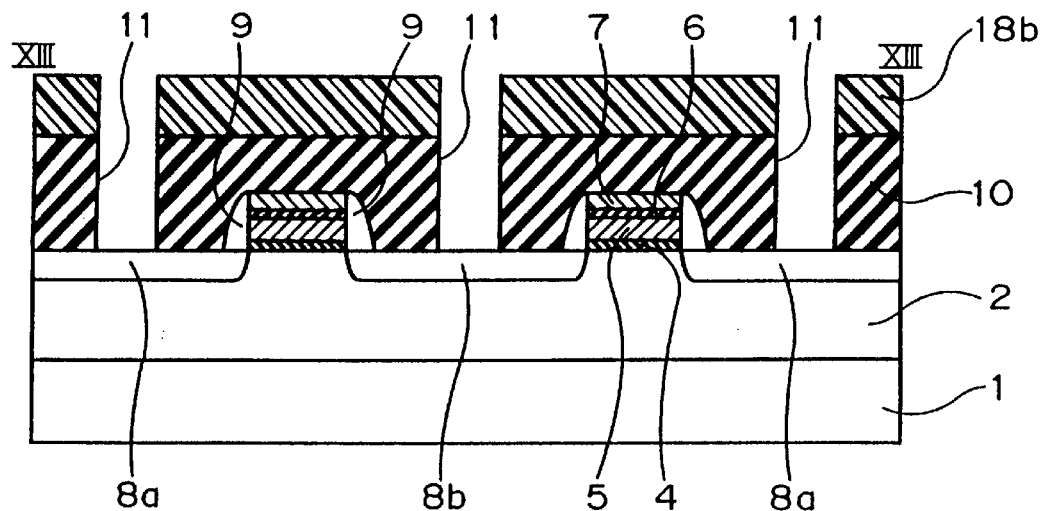
FIGS. 16A and 16B are cross-sectional views taken along the line XIII—XIII in FIG. 12, illustrating respective steps of a method of fabricating the memory cell array illustrated in FIG. 12.

As illustrated in FIG. 11C or FIG. 16A, there are formed the contact holes 11 reaching all the drain regions 8a and source regions 8b formed in the memory cell array.

Figure 16B:
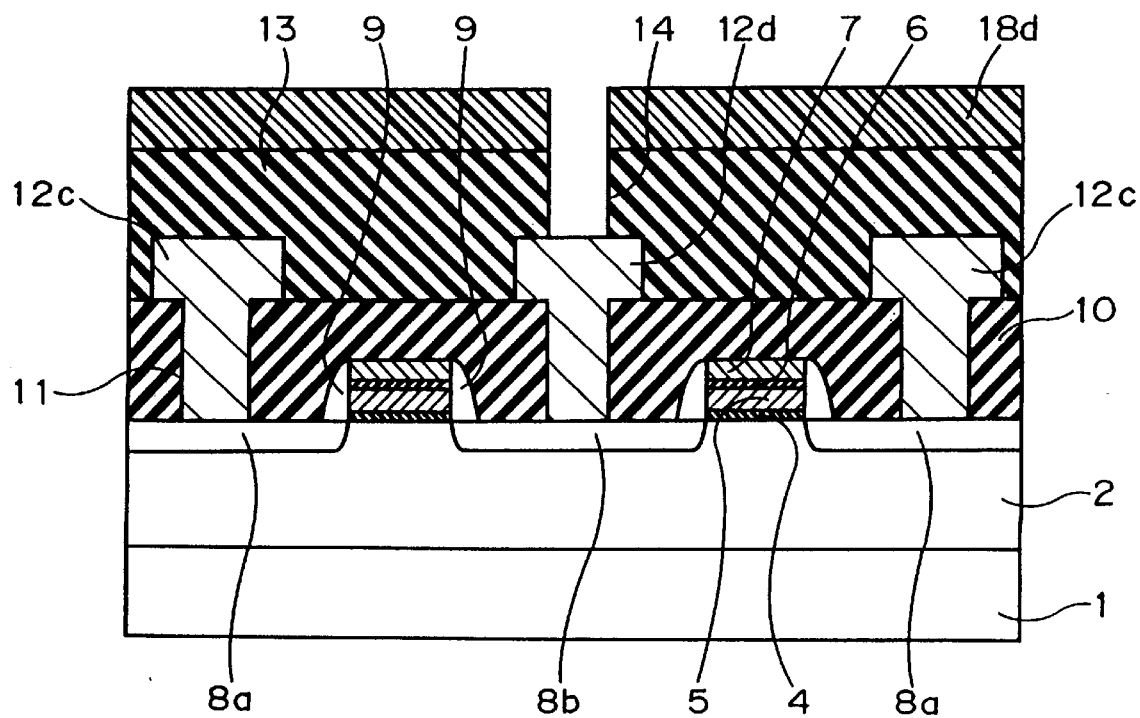

Then, as illustrated in FIG. 16B, aluminum alloy is deposited over the product by sputtering by a thickness in the range of about 4000 to about 6000 angstroms. The thus deposited aluminum alloy is patterned to thereby form a bit line 12c and a common extended source line 12d both as a first aluminum wiring layer. The bit line 12c extends almost in parallel with the field insulating films 3, and connects the drain regions 8a located in parallel with the field insulating films 3, to one another. The common extended source line 12d is a junction through which the source regions 8b make electrical contact with the common source line 15b.

Then, a second interlayer insulating film 13 composed of BPSG is deposited all over the product by CVD. The second interlayer insulating film 13 has a thickness in the range of about 4000 to about 5000 angstroms. Thereafter, a photoresist film 18d is formed, and then, patterned by photolithography and dry etching so as to have an opening above the source regions 8b. Then, the second interlayer insulating film 13 is etched by RIE with the patterned photoresist film 18d being used as a mask, to thereby form through-holes 14 reaching the common extended source line 12d.

After removal of the photoresist film 18d, as illustrated in FIG. 16B, an aluminum alloy film having a thickness in the range of about 4000 to about 6000 angstroms, as a second aluminum wiring layer, is deposited by sputtering over the product. Then, the aluminum alloy film is patterned by photolithography and dry etching to thereby form a common source line 15b in parallel with the word lines. The common source line 15b connects the source regions 8b located in parallel with the word lines, to one another.

Figure 13:
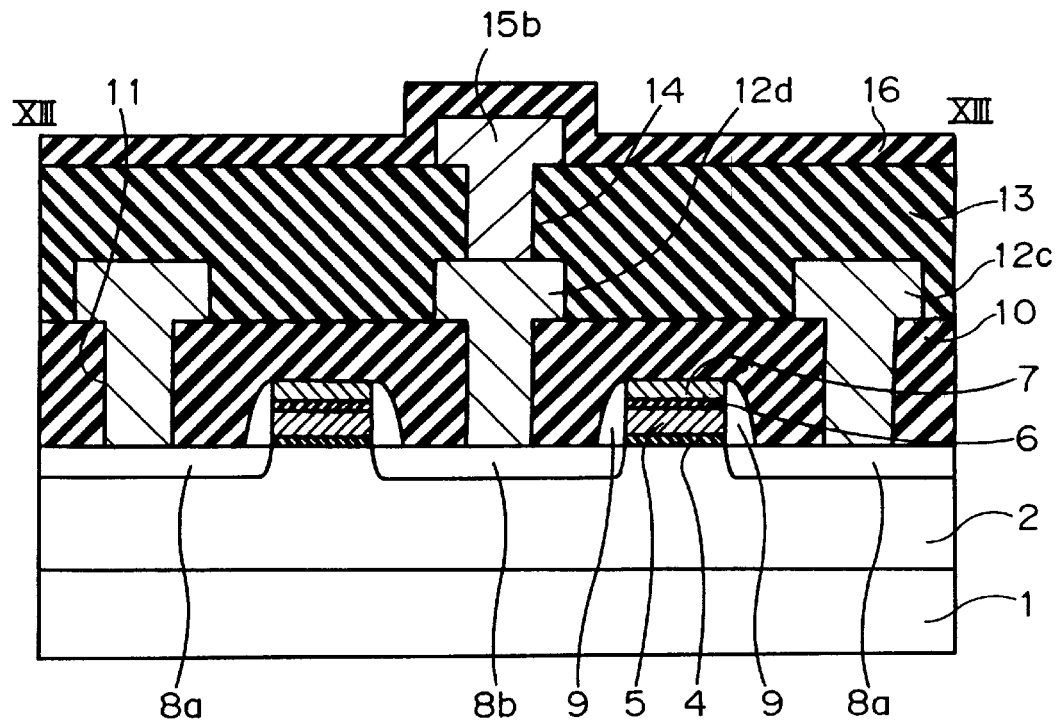
FIG. 13 is a cross-sectional view taken along the line XIII—XIII in FIG. 12.
Figure 14:
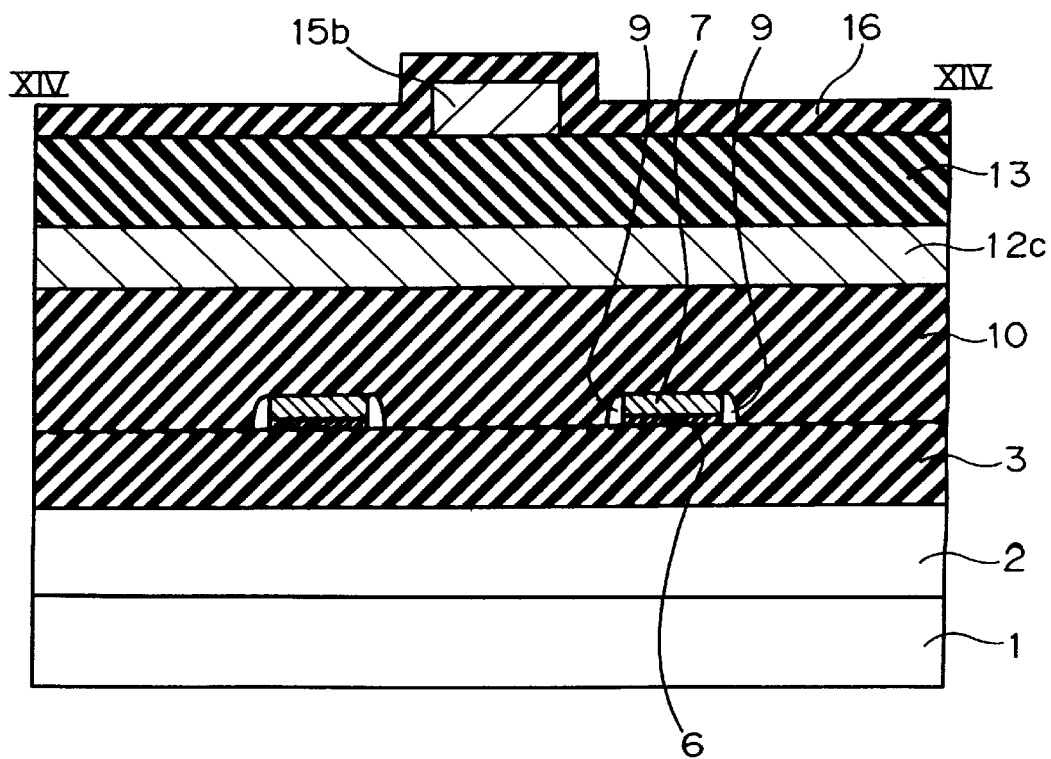
FIG. 14 is a cross-sectional view taken along the line XIV—XIV in FIG. 12.
Figure 15:
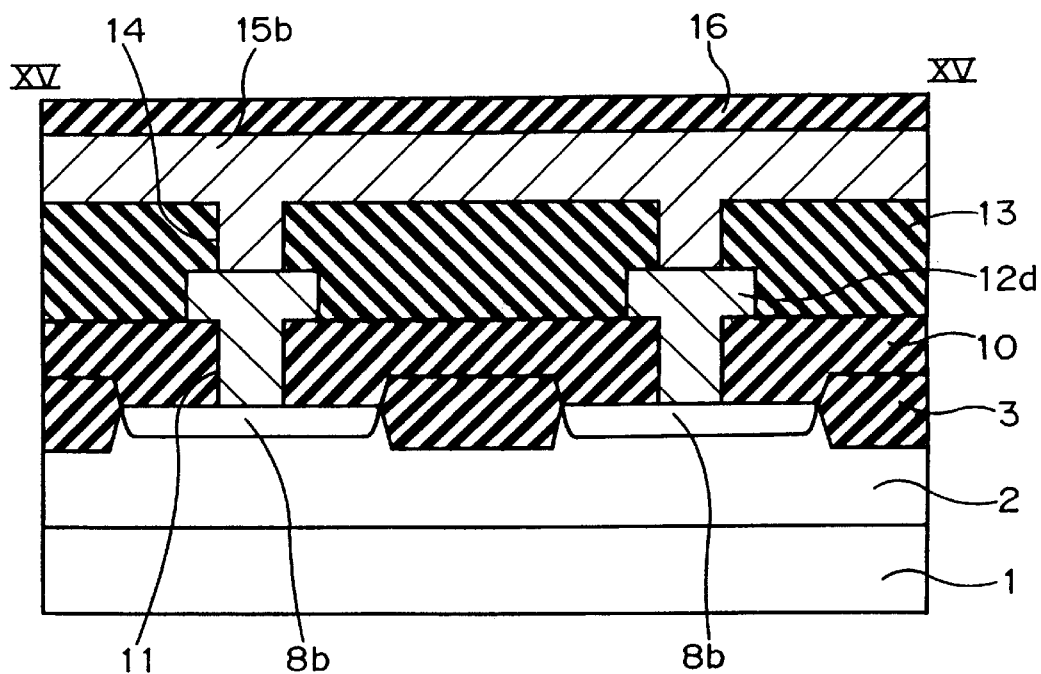
FIG. 15 is a cross-sectional view taken along the line XV—XV in FIG. 12.

Then, the product is entirely covered with a passivation film 16 composed of PSG. Thus, there is completed the memory cell array in accordance with the second embodiment as illustrated in FIG. 13.

In the above-mentioned second embodiment, a wiring layer constituted of the second aluminum wiring layer is only the common source line 15b. Hence, it is possible for the common source line 15b to have a greater width than a width of a common source line in the first embodiment, which ensures a further reduction in a resistance of the common source line 15b, resulting in that the memory cell could operate at a higher rate.

Third Embodiment

FIG. 17 is a plan view illustrating a memory cell array in accordance with the third embodiment. Parts or elements corresponding to those of the memory cell array in accordance with the second embodiment illustrated in FIG. 12 have been provided with the same reference numerals, and are not explained in detail.

The third embodiment is different from the second embodiment in that backing wiring layers 15c constituted of the second aluminum wiring layer are formed above the control gates 7, and connect to the control gates 7 at a certain interval.

In the second embodiment, since the second aluminum wiring layer is formed only into the common source line 15b, the common source line 15b was designed to have a greater width for lowering a resistance thereof. In the third embodiment, it is possible to operate a memory cell array at a higher rate by lowering a resistance of word lines.

The backing wiring layers 15c illustrated in FIG. 17 are designed to be connected to the word lines or control gates 7 via contact holes at every 32 bits, for instance.

The word lines are generally composed of polysilicon or polycide. However, these materials have greater resistivity than other metals. In addition, since the word lines are so long, a great degree of RC is generated in the word lines, and may cause a memory cell array to operate at a lower rate. To the contrary, in accordance with the present embodiment, the backing wiring layers 15c lower a resistance of the word lines, and hence, data-reading can be accomplished at a higher rate.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-205592 filed on Jul. 31, 1997 including specification, claims, drawings and summary is incorporated herein by reference in its entirety.

What is claimed is:

1. An EEPROM semiconductor device comprising:
   (a) a plurality of field insulating films each extending perpendicularly to word lines;
   (b) a plurality of memory cells arranged in a matrix, each memory cell including a floating gate, a control gate formed on said floating gate, the control gate also operating as one of said word lines that corresponds to a row in the matrix in which said each memory cell is disposed, and having source and drain regions located at either sides of said control gate;
   (c) a first bit line extending perpendicularly to said word lines and connecting drain regions of said memory cells with each other, said first bit line corresponding to a first metal wiring layer;
   (d) a first common source line extending in parallel with said word lines and connecting source regions of said memory cells with each other, said first common source line being disposed entirely above said word lines with respect to a distance from a semiconductor substrate, said first common source line having a top portion and a bottom portion with the top portion being wider than the bottom portion; and
   (e) a common extended source line that extends downwardly from said first common source line so as to connect said first common source line to a source region disposed within said semiconductor substrate, said common extended source line having a top portion and a bottom portion with the top portion of said common extended source line connected to the bottom portion of said first common source line, and with the top portion of said common extended source line being wider than the bottom portion of said common extended source line,
   wherein said first common source line corresponds to a second metal wiring layer,
   wherein said first common source line has a greater width than each of said word lines to result in a low resistance of said first common source line.

2. The EEPROM semiconductor device as set forth in claim 1, wherein said second metal wiring layer is composed of aluminum.

3. An EEPROM semiconductor device comprising:
   (a) a plurality of field insulating films each extending perpendicularly to word lines;
   (b) a plurality of memory cells arranged in a matrix, each memory cell including a floating gate, a control gate formed on said floating gate, the control gate also operating as one of said word lines that corresponds to a row in the matrix in which said each memory cell is disposed, and having source and drain regions located at either sides of said control gate;
   (c) a first bit line extending perpendicularly to said word lines and connecting drain regions of said memory cells with each other;
   (d) a first common source line extending in parallel with said word lines and connecting source regions of said memory cells with each other; and
   (e) backing wiring layers disposed above said word lines, each of said backing wiring layers being connected to a corresponding one of said word lines above which said each backing wiring layer is disposed, only at every i number of bits, wherein i is an integer greater than one,
   wherein a first portion of each of said backing wiring layers overlaps a corresponding one of said word lines and a second portion of said each of said backing wiring layers does not overlap said corresponding one of said word lines, and
   wherein said second portion is disposed closer to said first common source line than said first portion.

4. The EEPROM semiconductor device as set forth in claim 3, wherein both said backing wiring layers and said first common source lines are constituted of a second metal wiring layer.

5. The EEPROM semiconductor device as set forth in claim 3, wherein said backing wiring layers coupled to said word lines lower a resistance of said word lines with respect to said word lines that are not connected to said backing wiring layers.

* * * * *